United States Patent
Birurakis

(10) Patent No.: US 10,288,679 B2
(45) Date of Patent: May 14, 2019

(54) SYSTEM AND METHOD FOR PROVIDING TEMPORAL VISUALIZATION OF SIGNAL RELATIONSHIPS IN A COHERENT TIME-DOMAIN ATE TEST EXECUTION ENVIRONMENT

(71) Applicant: William Birurakis, Great Mills, MD (US)

(72) Inventor: William Birurakis, Great Mills, MD (US)

( * ) Notice: Subject to any disclaimer, the term of this patent is extended or adjusted under 35 U.S.C. 154(b) by 0 days.

(21) Appl. No.: 15/335,148

(22) Filed: Oct. 26, 2016

(65) Prior Publication Data

US 2018/0113169 A1    Apr. 26, 2018

(51) Int. Cl.
| | |
|---|---|
| G01R 31/317 | (2006.01) |
| G01R 31/28 | (2006.01) |
| G01R 31/3177 | (2006.01) |
| G06F 11/22 | (2006.01) |
| G06F 11/32 | (2006.01) |

(52) U.S. Cl.
CPC ... *G01R 31/31712* (2013.01); *G01R 31/2834* (2013.01); *G01R 31/3177* (2013.01); *G06F 11/22* (2013.01); *G06F 11/32* (2013.01)

(58) Field of Classification Search
None
See application file for complete search history.

(56) References Cited

U.S. PATENT DOCUMENTS

| | | | |
|---|---|---|---|
| 6,332,212 B1 * | 12/2001 | Organ | G06F 11/323 714/E11.181 |
| 2008/0074122 A1 * | 3/2008 | Barsumian | H04B 3/46 324/612 |
| 2017/0276725 A1 * | 9/2017 | Birurakis | G01R 31/31724 |

* cited by examiner

*Primary Examiner* — Justin R Knapp
(74) *Attorney, Agent, or Firm* — Jensen & Puntigam P.S.; Clark A. Puntigam

(57) ABSTRACT

The system includes an ATE which produces a plurality of test signals and test results for electronic devices by a test instrument or instruments therein. An execution engine responsive to the test results runs multiple test operations from the test instruments within a coherent time domain and maintains a temporal relationship between the multiple test results. The multiple test signals and test results are then displayed in a time coherent alignment.

23 Claims, 8 Drawing Sheets

SYSTEM AND METHOD FOR PROVIDING TEMPORAL VISUALIZATION OF SIGNAL RELATIONSHIPS IN A COHERENT TIME-DOMAIN ATE TEST EXECUTION ENVIRONMENT

TECHNICAL FIELD

The present invention relates to the field of Automated Test Equipment (ATE) systems display of results from test operations. More particularly, the invention relates to a process and method for the temporally coherent visualization and display of stimuli and/or acquisition signals and data points

BACKGROUND OF THE INVENTION

Prior art ATE test executives do not display automated test result stimuli and/or data acquisitions of a plurality of signal types, e.g. analog, digital, bus, with respect to the time reference of when the data was stimulated and/or acquired. Furthermore, the results display is often restricted to a single stimulus or acquisition of a signal. This limitation prevents the temporally coherent display of stimuli and/or acquisitions from two or more sources. Further, this restricts the analysis that can be performed on the test results, and prevents optimal debugging and refinement of test procedures. Modern ATE instruments have added the ability to perform multiple operations in parallel. That is, an instrument may now source different stimuli on multiple ports at once, or may make different data acquisitions on multiple ports at once. Traditional test program editors cannot easily display the results of these stimuli and/or acquisitions. Hence, there is a need for comprehensive visualization of ATE system stimuli and/or data acquisitions to more easily accommodate the display of multiple test signals, especially to more easily enable visualization of multiple test instrument operations in the ATE being executed in parallel or synchronously within a coherent or non-coherent time-domain.

SUMMARY OF THE INVENTION

Figure 1:
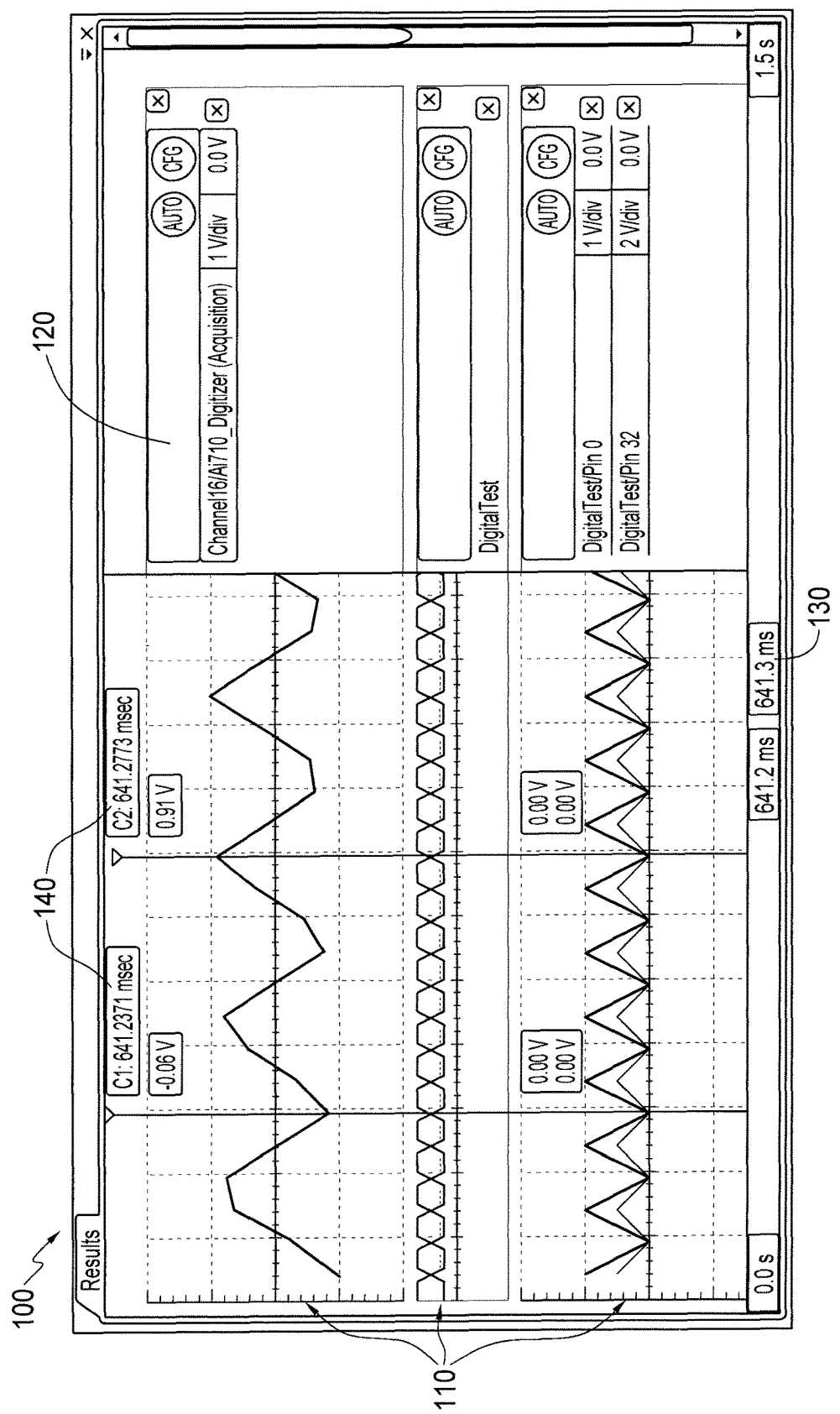
FIG. 1 is a screen shot illustrating the multi-channel results display area, where each acquisition data set is displayed on a separate trace set.

According, the present invention includes a system for displaying results obtained from a plurality of automatic test equipment (ATE) sources, comprising at least one ATE which includes one or more test instruments producing a plurality of test signals, stimulus signals or acquisition signals, and for producing test results obtained therefrom in testing of electronic devices or components; and an execution engine for combining the test results within a coherent time domain, maintaining a temporal relationships between them; and a display for showing the test results, in a time coherent alignment.

BEST MODE FOR CARRYING OUT THE INVENTION

In response to the need of a comprehensive visualization of ATE system test results data to accommodate the display of multiple test signals with respect to the time reference when the data was obtained, the solution herein provides a graphical representation of test results as they are generated by the innovative execution engine that runs multiple instrument operations within a coherent time domain, identifying the temporal relationship between a plurality of signals, enabling a superior analysis of test results and an enhanced refinement of test procedures via user interactive tools. Prior art may allow for the display of multiple signals (e.g. a multi-channel O-scope), however, in these cases, all channels are aligned on or use the same clock source and one of the same stimulus or acquisition type. The present invention allows the combination of and intermingling of analog stimulus, analog measurement, digital signals, et al, across multiple instruments and multiple clock sources to be visually depicted in a time coherent alignment.

The following are definitions are used in this description:

ATE Execution Engine—The specific component or capability of an ATE Test Executive that executes predefined test programs.

Automated Test Equipment (ATE)—an apparatus that performs tests on a device using automation to quickly perform stimuli and acquisitions and evaluate the results of said stimuli and acquisitions. The use of ATE includes a reference to Automated Test System (ATS) and other names for like systems that perform similar testing processes.

ATE Test Executive—software that operates as the overall manager of component systems in an ATE. More specifically, the test executive enables the creation and configuration of test programs as well as controls the execution of said test programs.

IS—Instrument Start

IOL—Instrument Operation Length

Instrument Operation—The logical instrument action, which may be a combination of physical instrument actions. That is, an operation may describe multiple actions which are performed together to accomplish a task.

Results View—the area of the IDE where the test results are graphically displayed in the time domain $T_0$—defines when the test timing starts $T_{0+IS}$—defines when an instrument operation starts $T_{0+IS+IOL}$—defines the end time of an instrument operation $T_n$—discrete time instance in time domain with reference to $T_0$ Temporally Coherent—Deterministic within the time domain.

Test Group—A test group consists of one or more test sequences.

Test Instrument—An operational element of an ATE used as a source of stimuli and/or to acquire data from UUTs under a test. The acquired data is used in producing test results.

Test Program—A set or collection of test groups.

Test Sequence—A series of operations that the user specifies for execution.

Time domain—contiguous time span over which one or more stimuli and/or acquisition datum are analyzed.

Timing Interval—The nominal duration the ATE test executive engine uses for synchronizing instrument operations.

Trace—The part of results view that displays the results that are produced by one instrument capability Trace Set—a group of traces that display the same type of signal results Unit Under Test (UUT)—A device or component that is being tested such as a circuit card or assembly of electronic components.

In general, in one aspect, the invention comprises an improved ATE test executive program, which provides a process and method for the visualization of automated test results stimuli and/or acquisition data coherently aligned in the time domain for the improved analysis of automated test results.

This ATE test executive contains two important innovations to enable the user to perform analysis of automated test results: the temporally coherent display of automated test results, and the interactive graphical adjustment and display of measurement time using measurement references, as discussed below. These innovations are applicable across signal types, stimuli, and/or acquisitions from different instruments. Additionally, should temporal coherence be disrupted, the Test Executive is able to display that information intuitively, graphically and texturally, to the user.

The execution of test programs by the application engine is central to the additional functionality and innovation provided by this test executive. The engine is responsible for ensuring that instrument operations by test instrument or instruments in the ATE start at the $T_{0+IS}$ interval and end at $T_{0+IS+IOL}$ interval as specified by the user. This ensures instrument operations occur at the same time after a test has started every time the test executes (repeatable). As a result, two test instrument operations on different channels, and hence potentially using different instruments, will execute at the same time with respect to the other every time the test executes. Test instrument operations can thus be said to be temporally aligned.

When test instrument operations are performed in a time-deterministic manner, automated test stimuli and/or acquisition datum can then be correlated in the time domain. Multiple signal types including: analog signals, digital signals, bus signals can all be temporally aligned. This enables analysis of the performance of multiple signals at a specific $t_n$ of the automated test.

Analysis of stimulus and/or acquisition data is enabled and enhanced through several displayed objects and user interactive tools. The results region of the ATE test executive provides standard graph functions such as zooming and panning. Users can mark positions of interest within the signal display region via one or more cursors using drag-and-drop interaction. Cursor positions represent the elapsed time since the beginning of a test in the continuous time domain. Furthermore, users can perform temporal measurements, using one or more cursors including measuring the time elapsed between marked positions. Analysis of signals of interest is facilitated by the ability to filter the display of automated test stimuli and acquisition data based on signal type.

Real-time user interaction with time coherent measurement references provides powerful results analysis capabilities and facilitates debugging and refinement of test procedures. Measurement references allow mathematical analysis to be performed on a subset of an acquired signal, called a measurement on acquisition within the test executive environment. A measurement reference may be used to set the starting time of the measurement on acquisition.

All measurement references defined in the test program are automatically displayed on the signal display region and can be manipulated by the user using drag-and-drop interaction. Manipulating the measurement reference during display of the results allows the user to select the acquisition data subset of interest. The position of the modified measurement reference may then be saved to the original test program. The modification is then used the next time the test is executed allowing interactive adjustment of each measurement reference as test development proceeds iteratively. This ability to modify a test graphically using existing test results data is a unique feature of the invention.

Within a temporally coherent automated test, there may exist instrument operations which execute for longer than expected. In some cases, this may delay the start of another instrument operation. The test executive engine dynamically detects when this delay occurs, and automatically adjusts the execution of subsequent operations accordingly. When the start time of an instrument operation is delayed, that information is communicated to the user. Graphically, instrument operation delay is represented by a red arrow symbol placed on the temporal axis at the configured start time, followed by a grey rectangle having the length equal to the delay time introduced by the previous operation.

FIG. 1 represents a screen shot of the test results display area 100, after executing the test program that performed among other operations, a parallel acquisition on three separate resources belonging to three different acquisition instruments. For each of these acquisition resources a separate trace 110 is created to display the acquired data. To better visualize the test results, each trace is displayed on a separate trace set 120, the header of the trace set displaying information specific to the corresponding instrument capability for which the signal was acquired. The display area provides a time selector scroll bar 130 that provides general time information for the executed test, enabling horizontal scrolling of the results area in time domain. Graphical cursors 140 can be used to facilitate the analysis of test results. They can be dropped on the traces, the display area can be centered on them, and they can be used to perform instantaneous measurements on displayed signals. Relative time measurements are also enabled between two cursors.

Figure 2:
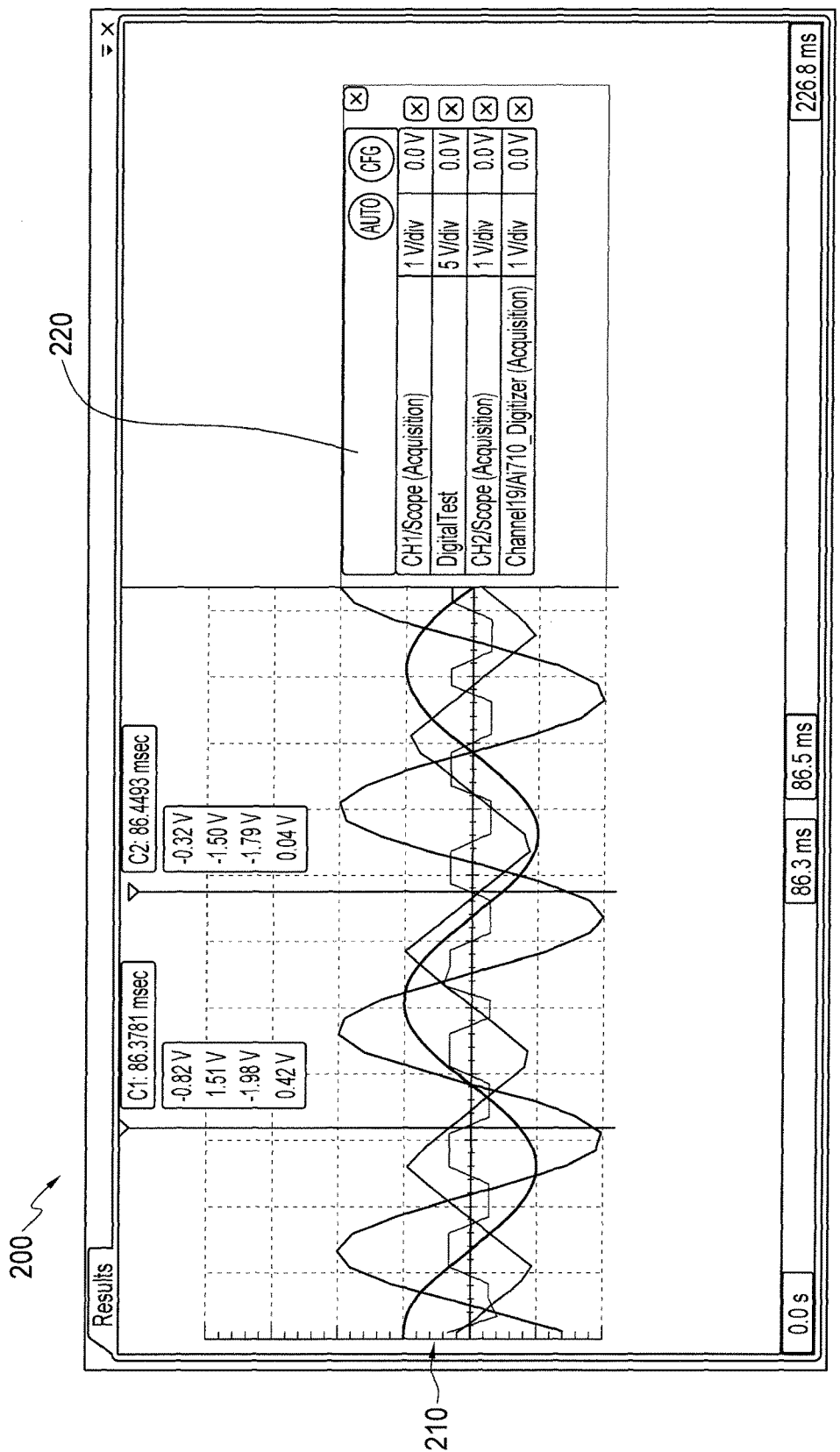
FIG. 2 is a screen shot illustrating the multi-channel results display area, where multiple data acquisition sets are displayed on the same trace set.

FIG. 2 is another screen shot of the test results display area 200, where the three acquired signals are represented in one trace set 210 to better visualize the synchronization of the signals that were executed in parallel and started simultaneously by the execution engine. The trace set header 220 contains information specific to all three instrument capabilities for which the displayed test results were acquired.

Figure 3:
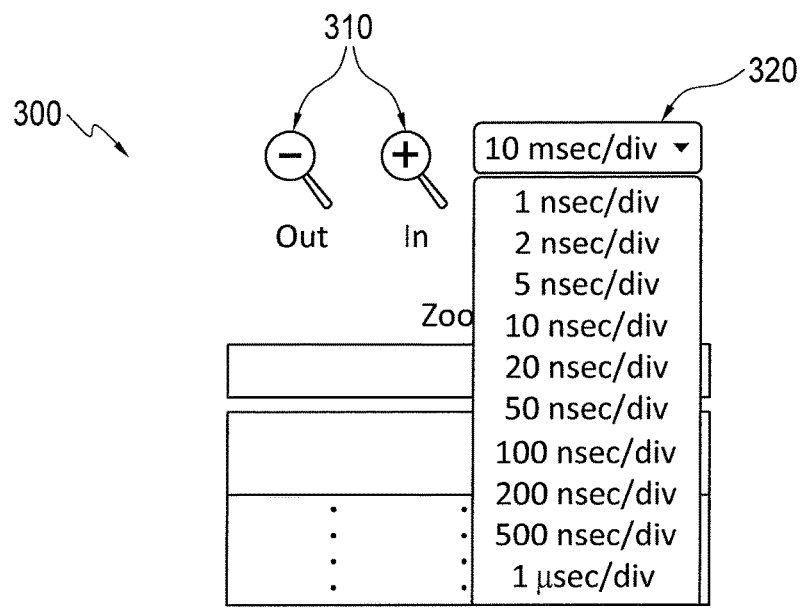
FIG. 3 is a screen shot illustrating the selection of zoom level for the multi-channel results display area.

FIG. 3 depicts some of the user interactive tools 300 that are provided by the application to facilitate the analysis of the test results. The entire test results display area can be zoomed in and out 310 to set the focus on a particular area of the displayed signals. A list of pre-defined division sizes 320 is also provided to enable a refined control of the graphical grid used by the results display area.

Figure 4:
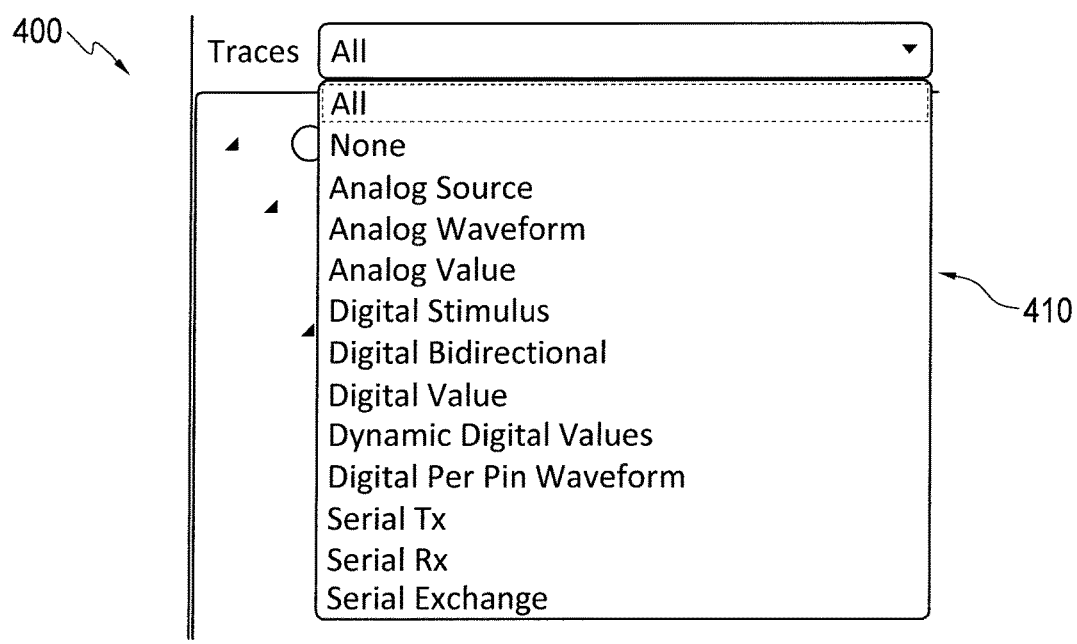
FIG. 4 is a screen shot illustrating the filtering of result types to be displayed.

FIG. 4 displays the list of available trace types 400 that correspond to signal types 410 that the test executive currently supports. Those having skill in the art will recognize that the list set out in FIG. 4 is exemplary and that the list of instruments and their capabilities can be expanded as testing requirements change. Selecting a specific signal type from this list will act like a filter on the test results, setting the focus on a particular type of result for viewing in the graphical display area.

Figure 5:
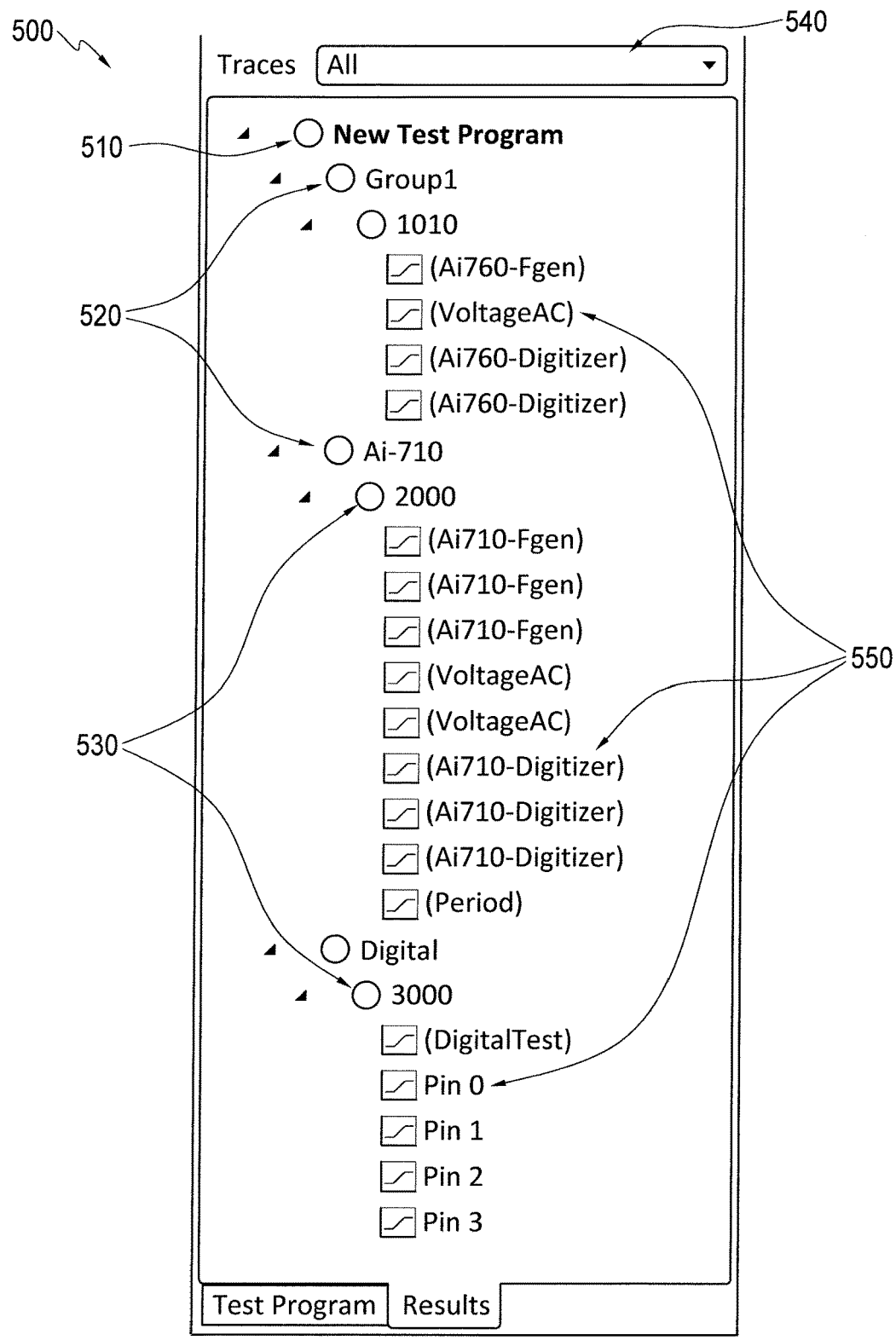
FIG. 5 is a screen shot illustrating a plurality of tests under several test groups.

FIG. 5 represents a screen shot of the results tree area 500 for an exemplary test program 510 run by the execution engine. The test program represents the root node 510 in the tree and it has one or more child nodes representing the test groups 520 that were executed. Each test group contains one or more child nodes representing the tests 530 that were executed under that particular test group. Under each test node there are several child nodes representing the traces 550 that have been generated for the executed test. The trace contains the results that were obtained for an instrument capability during the test execution. The combo-box 540 provided at the top of the tree are allows users to filter the results that are displayed based on the signal type. The list of supported signal types can be viewed in FIG. 4.

Figure 6:
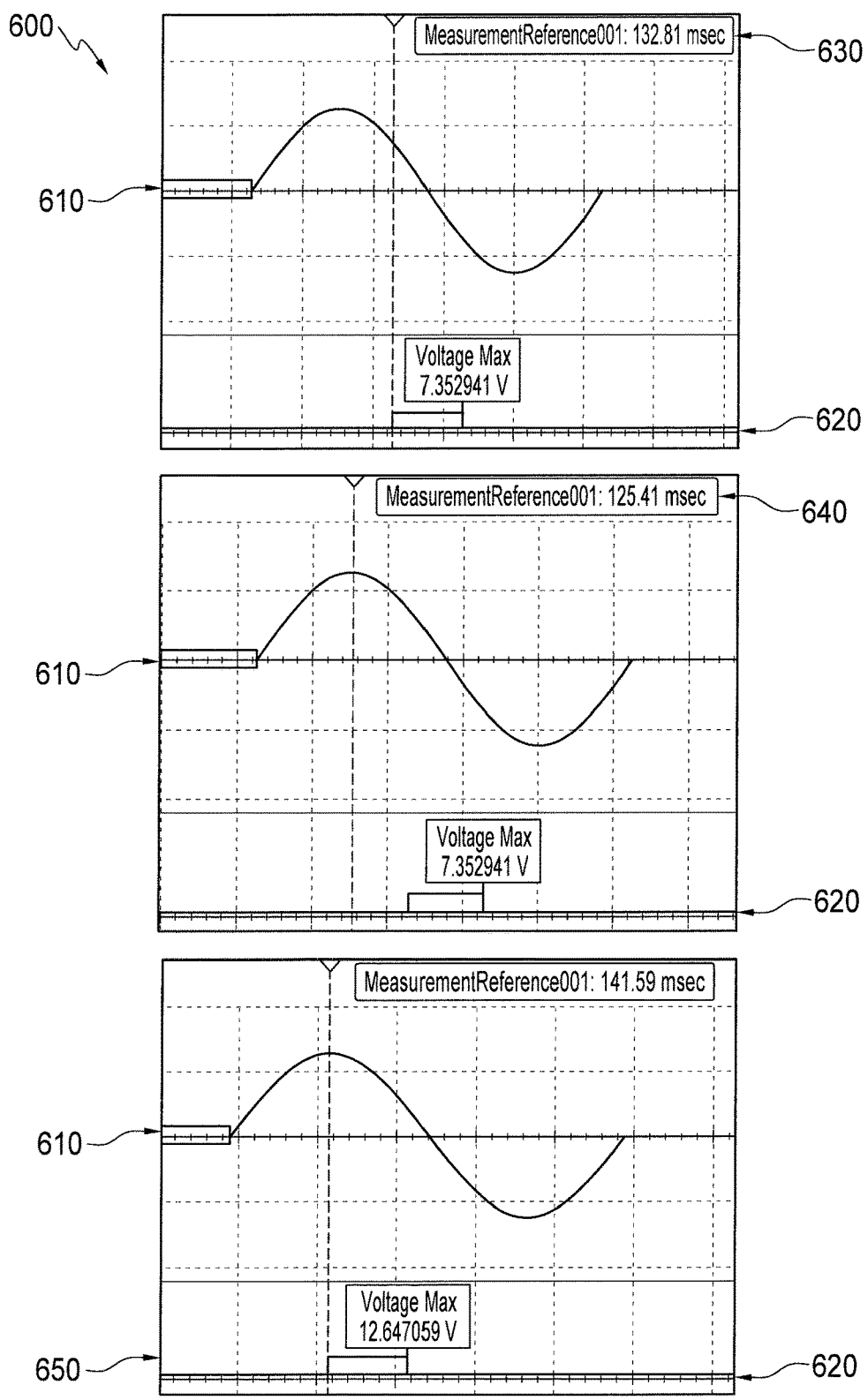
FIG. 6 represents three screen shots illustrating user interaction on the measurement reference and the result of this interaction on the measurement performed on an acquired signal.

FIG. 6 is an exemplary representation in the results display area 600 of an acquired signal 610, a measurement performed on that signal 620 and a measurement reference used at design time to set the start time of the measurement operation. The first screen shot shows an example where the measurement is not at the expected position 630 within the acquired signal data. To solve this problem, the user utilizes the interactive tools provided by the application and initiates a drag-and-drop operation on the measurement reference symbol 630 to move it to another position 640, in this case where the acquired signal reaches its peak in amplitude. The second screen shot is an illustration of the display after the user has dragged-and-dropped the measurement reference to this new position 640. This change is persisted and saved in the test data. A subsequent execution of this test will generate a new measurement on the acquired signal, this time producing the expected value. The third screen shot illustrates the display of the results after this new test execution, and it can be seen that the measurement has been adjusted to the new temporal position and the value of the measurement 650 differs from the initial one depicted in the first screen shot.

Figure 7:
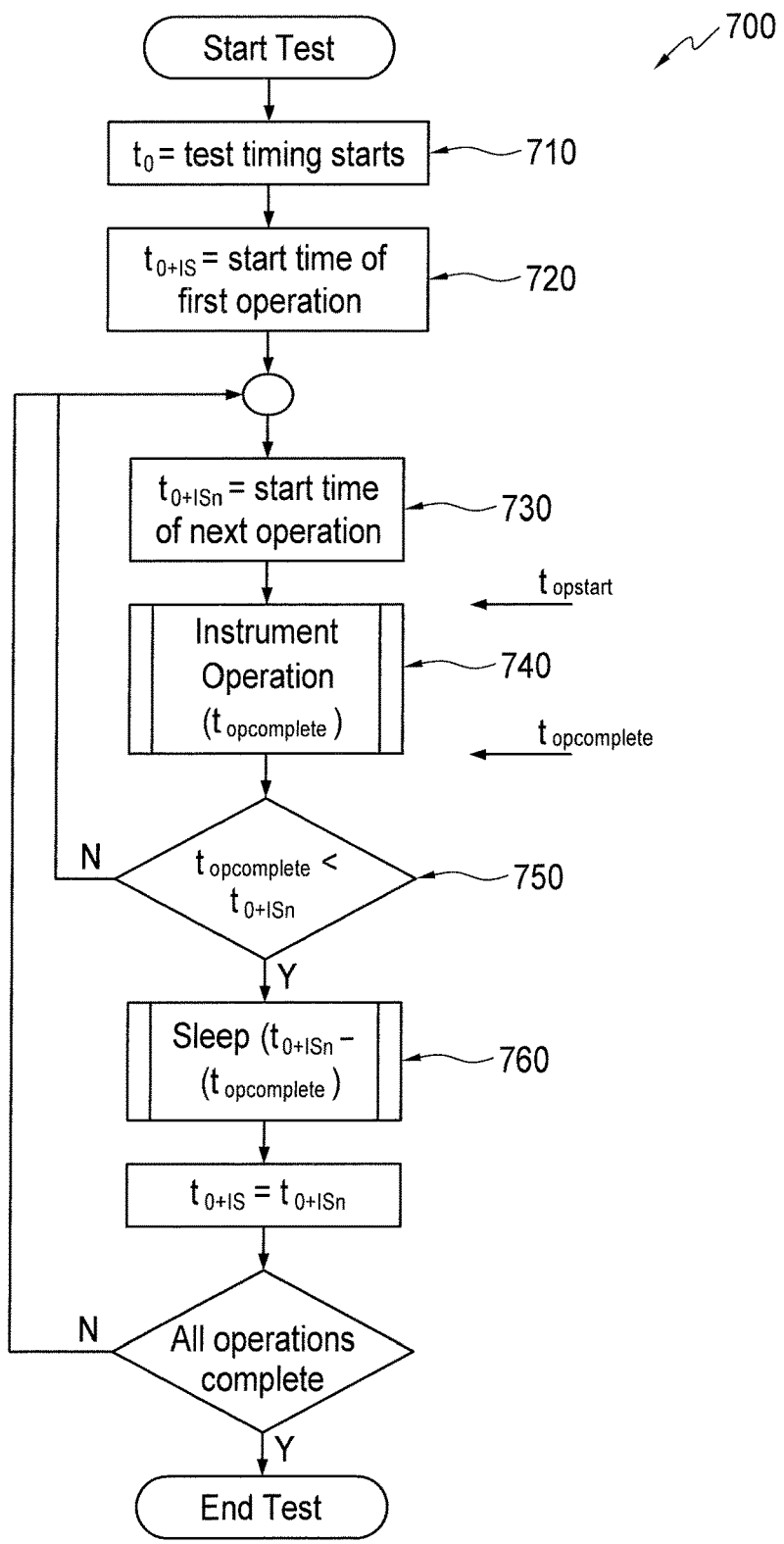
FIG. 7 is a flowchart for the computer program used in the present system to provide the temporal alignment of test instrument results.

FIG. 7 represents the flowchart of the algorithm 700 used by the test executive engine to maintain the temporal alignment of the instrument operations at run-time. This algorithm is applied to every test; the timing of test operations is reset at the beginning of each test execution 710. Each instrument operation is timed 720 and the configured start time of the next instrument operation determined 730 before the current instrument operation executes 740. The actual time when the current instrument operation is completed is compared 750 with the configured start time of the next instrument operation to determine if the current instrument operation has executed in a timely fashion. If the duration of the current operation exceeds its configured time, so that it runs over the start time of the next operation, the test executive engine adjusts the start time of the remaining operations and immediately starts the execution of the next instrument operation. If the current instrument operation runs under its configured time, the test executive engine executes a software delay 760 to wait until the start time of the next instrument operation is reached, and then repeats this entire process for the remaining instrument operations of the current test.

Figure 8:
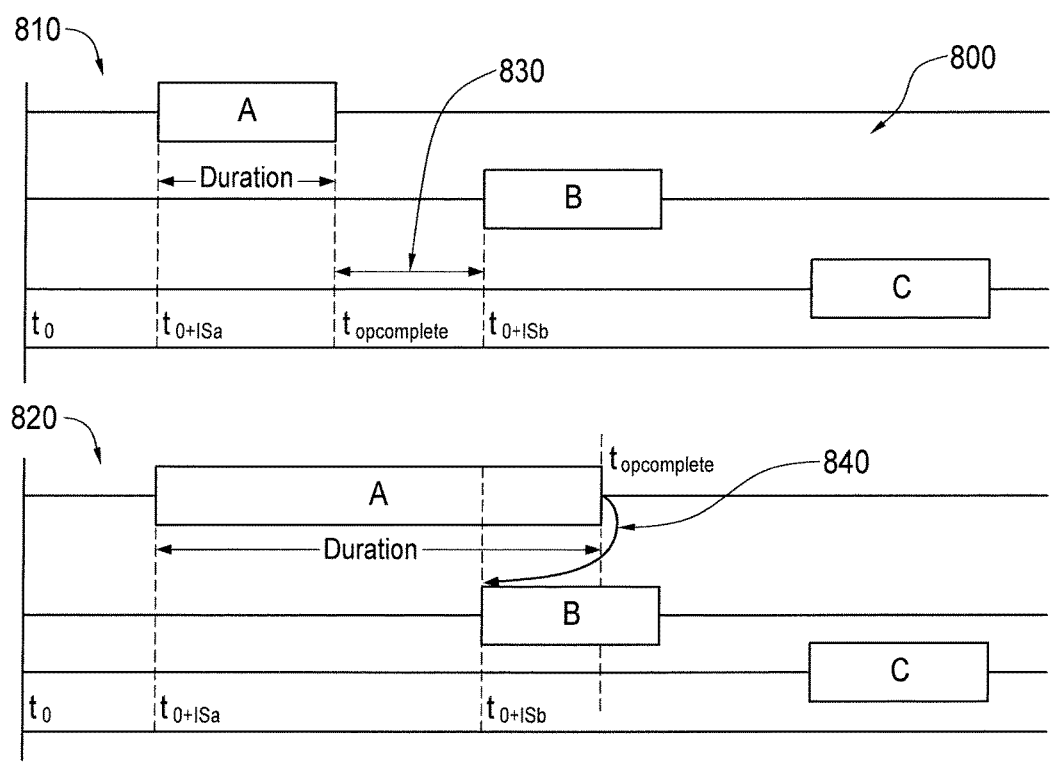
FIG. 8 is a graphical representation of the operation of the flow chart of FIG. 7.

For a better understanding of the algorithm described in FIG. 7, a graphical representation of this algorithm 800 is illustrated in FIG. 8. The first diagram 810 illustrates the test executive engine introducing software delays 830 to ensure that each test instrument operation starts at the configured time. This is the case where all instrument operations run in their configured times. The second diagram 820 illustrates an instrument operation "A" exceeding its configured duration 840 and causing the remaining operations to have their start time adjusted in order to maintain their temporal alignment. Similar adjustments can be made if the instrument operation is less that its configured duration.

Figure 9:
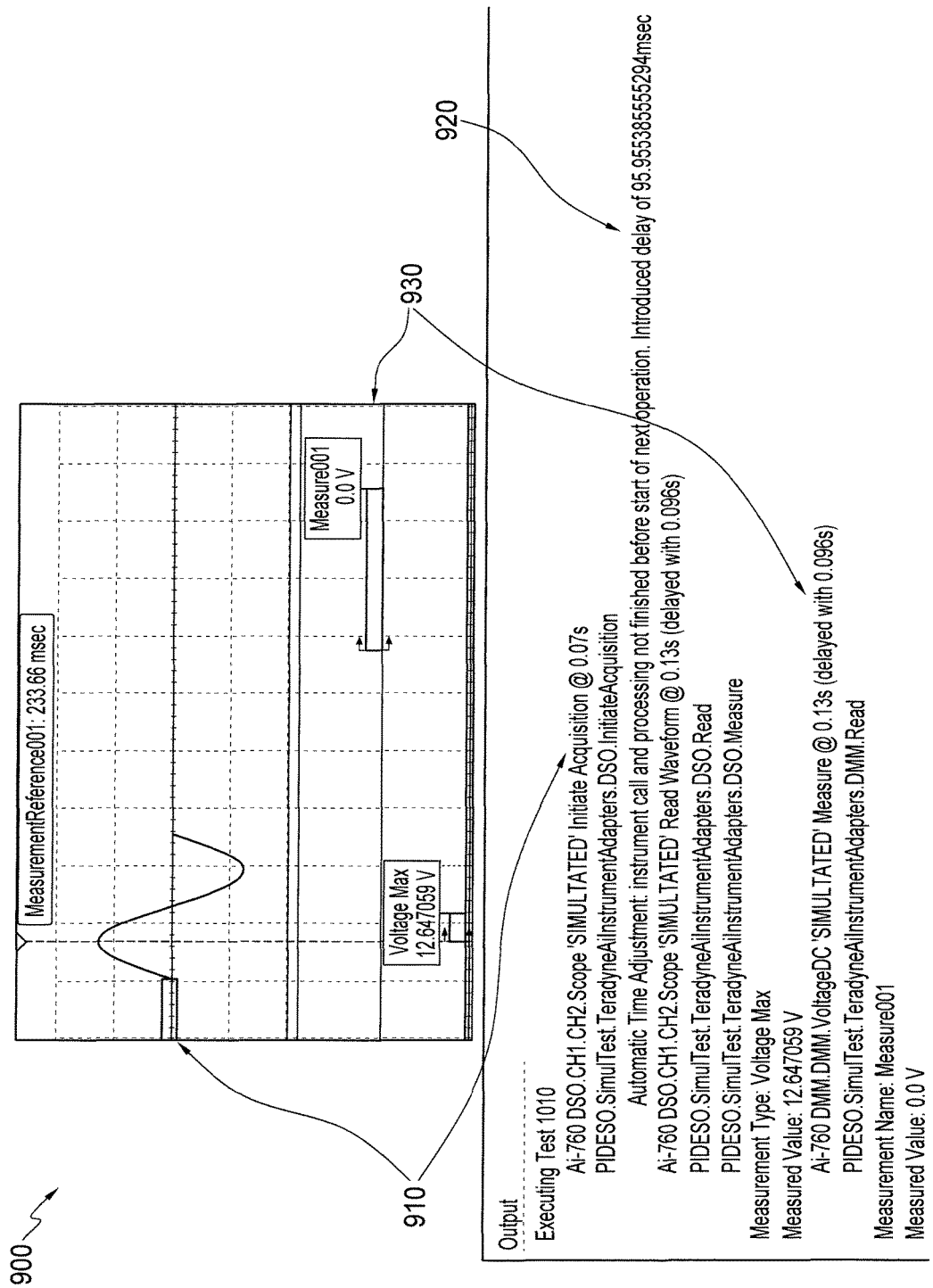
FIG. 9 is a screen shot of an exemplary test result, along with associated message logs.

FIG. 9 represents a screen shot of an exemplary test results graphical display 900 along with the message logs that were generated during test execution. The instrument operation that ran longer than its configured duration is the initiate acquisition 910. A meaningful message is displayed in the execution log output area. This message states that an automatic time adjustment took place, specifies the instrument operation that caused this time adjustment 910 and the delay introduced by this instrument operation 920. The operation whose start time was delayed is the measurement operation 930. The delay time is displayed both in graphical manner on the trace set in the form of a gray rectangle 930, and in a textual form 930 in the execution log output area.

Although a preferred embodiment has been disclosed for purposes of illustration, it should be understood that various changes, modifications and substitutions may be incorporated in the preferred embodiment without departing from the spirit of the invention as defined by the claims which follow:

What is claimed is:

1. A process for improving performance of an ATE by generating and receiving test results from a plurality of automatic test equipment (ATE) test operations for testing operation of electronic devices or components located externally to the ATE, comprising the steps of:
    generating a plurality of separate test signals or stimulus signals from one or more separate test instruments present in the ATE defining a plurality of separate test operations comprising a current test, wherein each test operation has an established configured time;
    recognizing when any one of the test operations in the current test is greater than or less that its established configured time;
    adjusting a start time of any remaining test operations in the current test to maintain a temporal relationship of the test operations in the current test; and
    generating a message indicating the test operation causing the start time adjustment.

2. The process of claim 1, wherein the test results include one or more data acquisitions obtained by the one or more test instruments and further include user performed measurements.

3. The process of claim 1, wherein the test signals allow for a single or a plurality of clock sources.

4. The process of claim 1, wherein the test results allow for a single or a plurality of clock sources.

5. The process of claim 1, wherein the test results include a display which shows the test signals.

6. The process of claim 5, wherein the display covers a selected interval of time, selected by a user.

7. The process of claim 5, wherein the display covers a selected point in time, selected by a user.

8. The process of claim 5, wherein the display is adjustable by a user.

9. The process of claim 5, wherein the display includes a graphical display.

10. The process of claim 9, including a capability of zooming in or out relative to the graphical display.

11. The process of claim 9, including a capability of a drag and drop operation by a user of the ATE.

12. The process of claim 9, wherein the graphical display includes message logs generated during execution of the test operations.

13. The process of claim 9, wherein a user can pan the graphical display.

14. The process of claim 9, wherein a user can mark points of selected interest in the graphical display.

15. The process of claim 14, including cursors used to measure time elapsed between marked display points.

16. The process of claim 5, wherein the display can accommodate various test signal types.

17. The process of claim 5, including a graphical cursor useful to perform measurements on selected areas of the display.

18. The process of claim 1, wherein control of the ATE test instruments begins and ends at selected times.

19. The process of claim 1, wherein the process can use analog test signals, digital test signals and bus test signals.

20. The process of claim 1, including a capability of modeling a test graphically using previous or existing test results.

21. The process of claim 5, wherein a test operation generated by the at least one ATE represents a root node of a test results tree area, with one or more child nodes representing test operations which were executed.

22. The process of claim 1, wherein the user can graphically adjust measurement intervals for test operations.

23. The process of claim 1, wherein a test operation can be modified graphically using existing test results.

* * * * *